(12) United States Patent
Davis

(10) Patent No.: US 6,556,211 B2
(45) Date of Patent: Apr. 29, 2003

(54) METHOD FOR CONSTRUCTING ARCHITECTURAL MODELS INCLUDING SCALED SURFACE TEXTURES

(75) Inventor: Steve Davis, Owasso, OK (US)

(73) Assignee: Punch Software, LLC, Kansas City, MO (US)

( * ) Notice: Subject to any disclaimer, the term of this patent is extended or adjusted under 35 U.S.C. 154(b) by 0 days.

(21) Appl. No.: 10/108,120

(22) Filed: Mar. 26, 2002

(65) Prior Publication Data

US 2002/0126131 A1 Sep. 12, 2002

Related U.S. Application Data

(63) Continuation of application No. 09/324,219, filed on Jun. 2, 1999, now Pat. No. 6,404,424.

(51) Int. Cl.[7] .............................................. G06F 17/00
(52) U.S. Cl. ...................... 345/582; 345/418; 345/629; 700/182
(58) Field of Search ................................ 345/418, 419, 345/420, 421, 423, 429, 430, 629, 630, 641, 664, 679, 582; 703/1, 22, 26; 706/10; 358/1.1; 700/180, 181, 182

(56) References Cited

U.S. PATENT DOCUMENTS

| 4,546,434 A | 10/1985 | Gioello |
| 4,640,529 A | 2/1987 | Katz |
| 4,847,778 A | 7/1989 | Daley |
| 4,970,666 A * | 11/1990 | Welsh et al. ................. 345/423 |
| 5,488,699 A | 1/1996 | Hanson, Jr. |
| 5,495,568 A | 2/1996 | Beavin |
| 5,689,435 A | 11/1997 | Umne et al. |
| 5,740,051 A | 4/1998 | Sanders, Jr. et al. |
| 6,018,625 A | 1/2000 | Hayball et al. |
| 6,088,689 A | 7/2000 | Kohn et al. |
| 6,404,424 B1 * | 6/2002 | Davis ......................... 345/418 |

FOREIGN PATENT DOCUMENTS

JP    11224045    8/1999

* cited by examiner

*Primary Examiner*—Matthew C. Bella
*Assistant Examiner*—Wesner Sajous
(74) *Attorney, Agent, or Firm*—Hovey Williams LLP

(57) ABSTRACT

A method of creating architectural models that includes scaled surface textures for at least one exterior surface of the architectural design is provided. The method includes printing scaled templates for component parts of an architectural model and a set of building instructions for the architectural model suing a computer-aided design system. Once the scaled templates for the component parts are printed, they are trimmed and affixed to a suitable model-making material, such as foamboard, after which the model-making material is trimmed to correspond to the shape of each template. The component parts are assembled and a plurality of template texture overlays are printed, which correspond to the desired surface textures and colors of the component parts forming the model. The scaled template texture overlays are permanently affixed to the component parts.

29 Claims, 8 Drawing Sheets

METHOD FOR CONSTRUCTING ARCHITECTURAL MODELS INCLUDING SCALED SURFACE TEXTURES

RELATED APPLICATIONS

The present application is a continuation of and claims priority benefit of a U.S. patent application titled METHOD FOR CONSTRUCTING ARCHITECTURAL MODELS INCLUDING SCALED SURFACE TEXTURES; Ser. No. 09/324,219; filed Jun. 2, 1999 now U.S. Pat. No. 6,404,424, which is hereby incorporated into the present application by reference.

FIELD OF THE INVENTION

This invention relates to a method for constructing architectural models. More specifically, the invention is directed to an architectural model making method, which results in the construction of three-dimensional architectural models including scaled surface textures on at least the exterior surfaces thereof.

BACKGROUND OF THE INVENTION

In the construction industry, it is often desirable to reduce an architectural design to a physical model of the structure so that it can be presented to a client for consideration, modification or approval. Generally speaking, architectural models are prepared early in the design process before detailed structural analyses are performed. Nonetheless, architectural models are a critical step in the building design process, since they allow a client to visualize a completed design via a physical, tangible structure.

Basic architectural models have been made for years by architects and the like in order to present their designs to clients. Typically, an architect would prepare a set of rough plans for a structure and then transfer scaled dimensions from the rough set of plans to a suitable model-making material, such as cardboard or foamboard. This would require the architect to draw the outlines of various components parts of the structure onto the construction material, which would require measuring and manual scaling of the parts, cut out the various component parts and then assemble them into a finsished model using tape and glue according to the rough set of architectural plans. While this process provides a suitable structure from which a client can percieve a completed design, it is time consuming and sometimes cost-prohibitive. It often also fails to provide visual information related to the exterior surface textures of the various component parts of the structure.

In order to provide such information, an architect or building designer would need to utilize his or her artistic skills in coloring each component part to achieve a desired exterior surface effect.

In the recent past, the proliferation of computer aided design systems and programs has greatly enhanced the architectural design process. Using available systems and software, an architect can readily design a structure and quickly prepare a computer-generated rendering of the finished structure. While computer-generated renderings can be viewed from many angles and can include surface textures that can be readily interchanged, current technology dictates that they must be displayed on a computer display screen and that a computer system including an appropriate computer aided design software package is available in order to reproduce them. Thus, while they can provide an architect with the ability to present an initial design to a client at the architect's office computer-generated renderings can not replace the use of architectural models, which can be delivered to a client and studied by the client over time at his or her home or office.

Accordingly, there still exists a need for an architectural model making system and method, which takes advantage of the abilities of computer aided design systems and software packages to produce scaled, architectural models of buildings including scaled surface textures of at least the exterior portions thereof.

SUMMARY OF THE INVENTION

The present invention satisfies this need by providing a method of creating architectural models that includes providing a computer-aided design system including a processor, at least one input device, a visual display device, and an output printer for generating a complete architectural design, including surface textures for at least one exterior surface of the architectural design. The method includes printing scaled templates for component parts of an architectural model and a set of building instructions for the architectural model using the computer-aided design system. Once the scaled templates for the component parts are printed, they are trimmed to the size marked on the templates and are affixed to a suitable model making material, such as foamboard, after which the model-making material is trimmed to correspond to the shape of each template. Once the component parts are cut to shape, a plurality of template texture overlays are printed, which correspond to the desired surfaces of the component parts. These scaled template texture overlays are then permanently affixed to the component parts.

The component parts are assembled according to the building instructions to create the completed three-dimensional architectural model. In the preferred embodiment, a color printer is utilized to allow for the creation of photo-realistic, colored texture overlays.

DESCRIPTION OF THE DRAWINGS

These and other features and advantages of the present invention will be better understood by reading the following detailed description, taken together with the drawings wherein.

DETAILED DESCRIPTION OF THE PREFERRED EMBODIMENT

Figure 1:
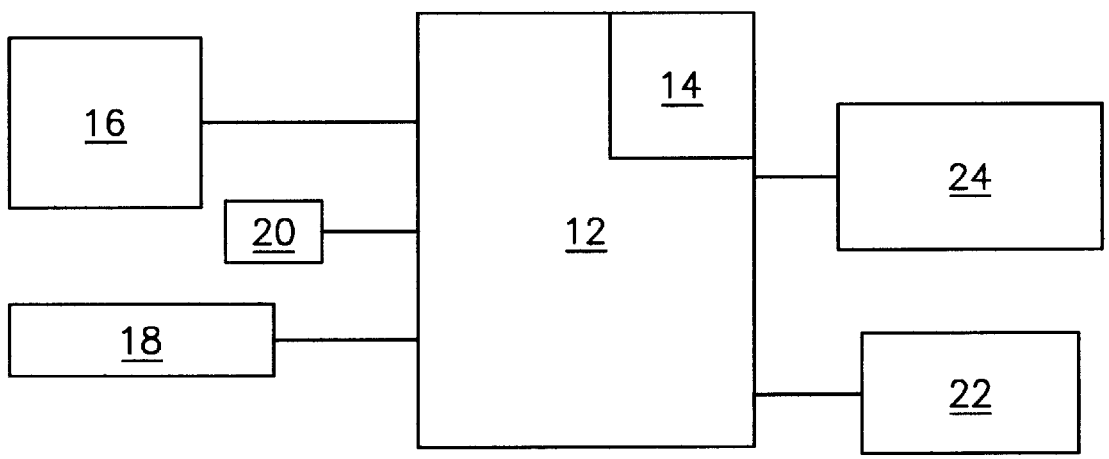
FIG. 1 is a schematic block diagram of the components of a computer-aided design system used for the disclosed architectural model-making method.

Turning now to the figures and, in particular, FIG. 1, a computer-aided design system, such as are well known to those skilled in the art, is shown. The computer-aided design system 10 includes a CPU 12 for processing design information, memory 14 for storing design information, including a plurality of surface texture and colors and a number of peripheral components. The peripheral components include display unit 16, input devices, such as keyboard 18 and mouse 20 as well as output devices, such as printer 22 and plotter 24. These system components are common amongst the majority of computer-aided design systems and allow an architect or designer to prepare detailed designs for structures to be constructed.

Figure 2:
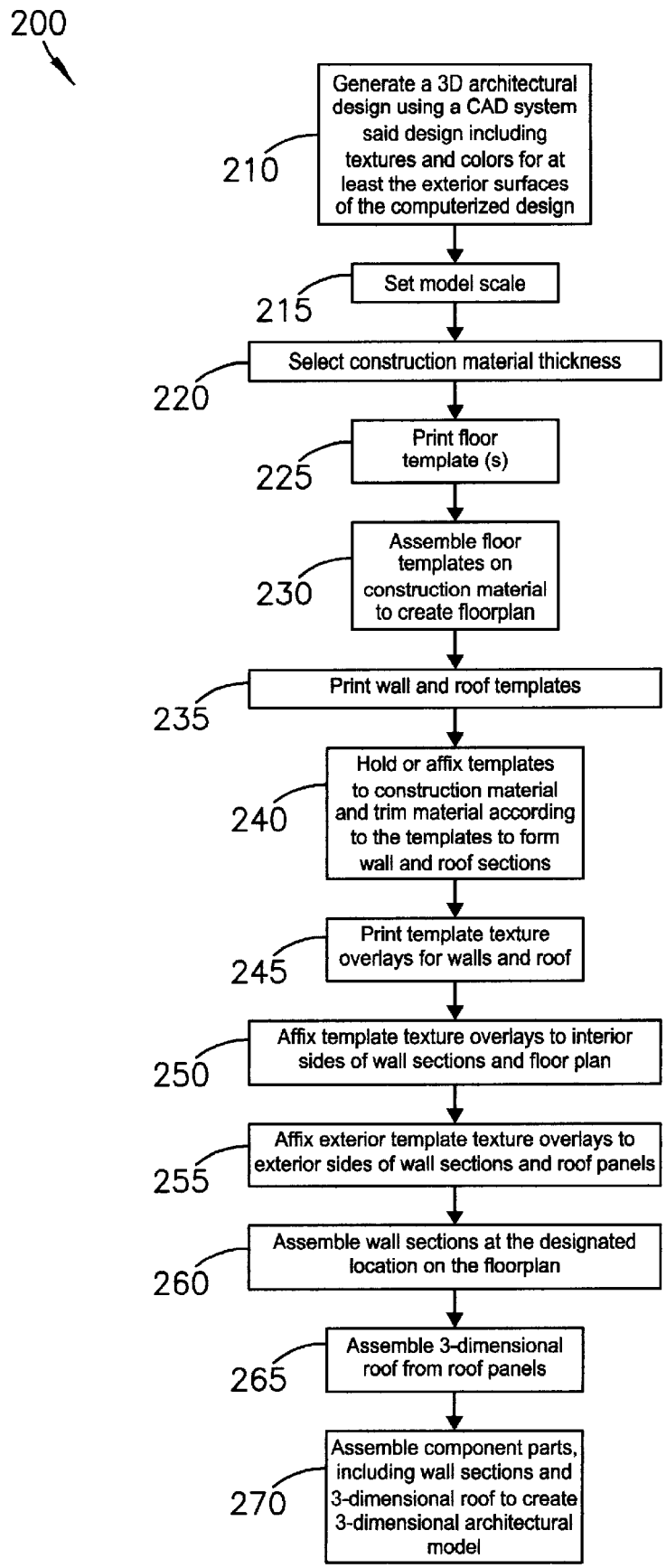
FIG. 2 is a flow diagram of the steps included in a three dimensional architectural model-making method according to the present invention.

It is in conjunction with these, well known, computer-aided design systems that he disclosed method of creating three-dimensional architectural models operates. As shown in FIG. 2, a method 200 for creating three-dimensional architectural models according to the present invention is shown.

Method 200 begins with the creation of an architectural design (preferably a 3D design) using a computer-aided design system, step 210. In one preferred embodiment, the generated architectural design includes surface textures and colors of at least the exterior surfaces of the walls and roof of the design. In another embodiment, both interior and exterior wall surface colors and textures are provided. In yet another embodiment, floor and ceiling textures may also be provided.

Once the architectural design is completed, the designer who wishes to create a three-dimensional architectural model of the design must set a model scale, step 215. Once the model scale is selected, the model maker must then inform the system of the thickness of the construction material that will be utilized for the model, step 220. The model maker is thereafter ready to begin the creation of the actual model.

The first step in the actual model-making process is to print out at least one floor template, step 225. Then, the floor template or templates are assembled on the chosen construction material to create a floorplan for the architectural model, step 230. Floor templates may be prepared for the first, second, third or subsequent floors of the structure.

Once the floor panels are prepared, the next step is to print all wall and roof templates for the design, step 235. Next, the model maker will use the wall templates as a guide to assist him or her in cutting out panels of construction material to the size of the templates, step 240. This may be accomplished by either temporarily or permanently holding, gluing or otherwise affixing the wall templates to the construction material. If gluing is utilized, then a permanent glue should be utilized since the wall templates will become an integral part of the completed architectural model.

Once the floor, wall, and roof panels are prepared, the next step in creating the three-dimensional architectural model is to print and trim template texture overlays for the various panels, step 245. These texture overlays include textures and colors for the various building materials selected. For example, a desired shade of exterior brick work may be selected or a specific clapboard or shake spacing may be desired. Additionally, various roofing material may be selected in a variety of colors.

In a more sophisticated embodiment of the invention, interior texture overlays may be printed as well. Interior texture overlays could provide an architectural model with realistic interior features, such as hardwood floors, carpeting, and a variety of colors for interior wall panels. Texture overlays could also provide wallpaper effects for interior walls if desired. The actual materials, colors and textures are selected when the architectural design is created using the computer-aided design package.

Once all of template texture overlays are printed and trimmed to size, if interior texture overlays are to be utilized in the specific model being constructed, then the interior template texture overlays must be affixed to the interior surfaces of the appropriate model panels including walls, floors and ceilings, step 250. Preferably, the template texture overlays are glued to the interior surfaces of the appropriate model panels using a permanent glue. The template texture overlays for all of the exterior surfaces of the model are affixed, using glue or the like, to the appropriate sections of the constructed model, step 255.

At this point, the wall panels should be assembled, step 260. The wall panels may be assembled together prior to affixing them to the floor plan or, they may be partially assembled at this stage to facilitate the application of texture overlays to the interior surfaces thereof, which will be discussed below.

The roof panels are then either partially or completely assembled, step 265, to produce a three-dimensional roof according to the architectural design.

Then, in step 270, the component parts that comprise the complete architectural model are assembled to create the model. In this manner, a complete architectural model of a design, which includes texture and colors of at least the exterior surfaces of the model and perhaps even the interior surfaces of the model is created.

Of course, the invention contemplates performing the above-identified steps in slightly different orders. For example, templates may be printed in groups and certain assemblies or subassemblies may be created prior to the printing of all of the templates or template texture overlays.

Figure 3:
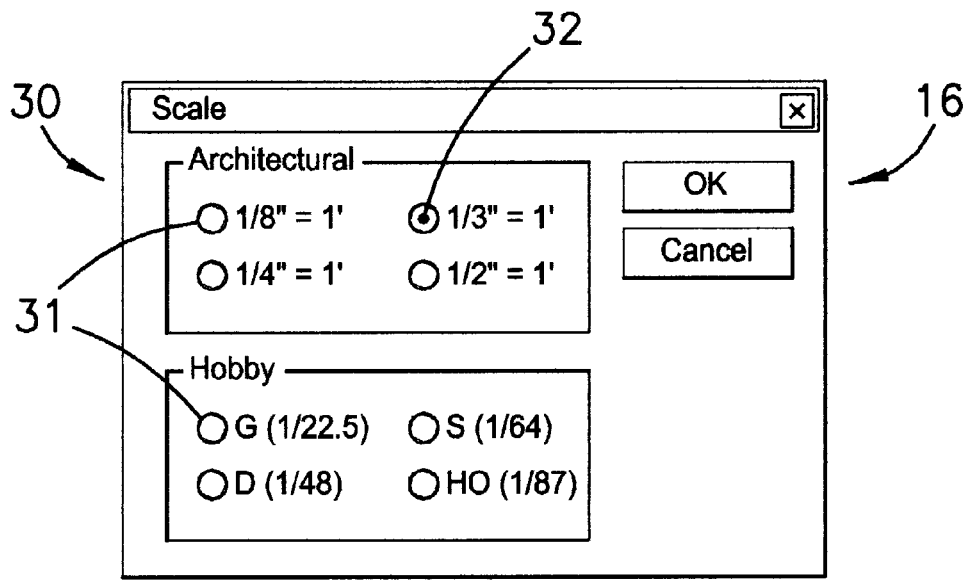
FIG. 3 is a scale dialogue box as it would appear on the computer aided design system display, which allows a model maker to select an appropriate scale for the architectural model.

Details of the specific steps of method 200 will be explained with reference to FIGS. 3–11. Turning now to FIG. 3, a computer screen display 30 especially designed to facilitate the selection of a desired scale for the architectural model (step 215 of FIG. 2) is selected from a dialogue box displayed on the computer-aided design system display 16. The desired scale is selected by clicking on the appropriate radio button 31 shown on display 16 using an input device, such as mouse 20 (FIG. 1). In the example shown, a one-half inch equals 1 foot scale radio button 32 is selected, which would result in a 10 foot long wall printing out as a five inch wall template.

Figure 4:
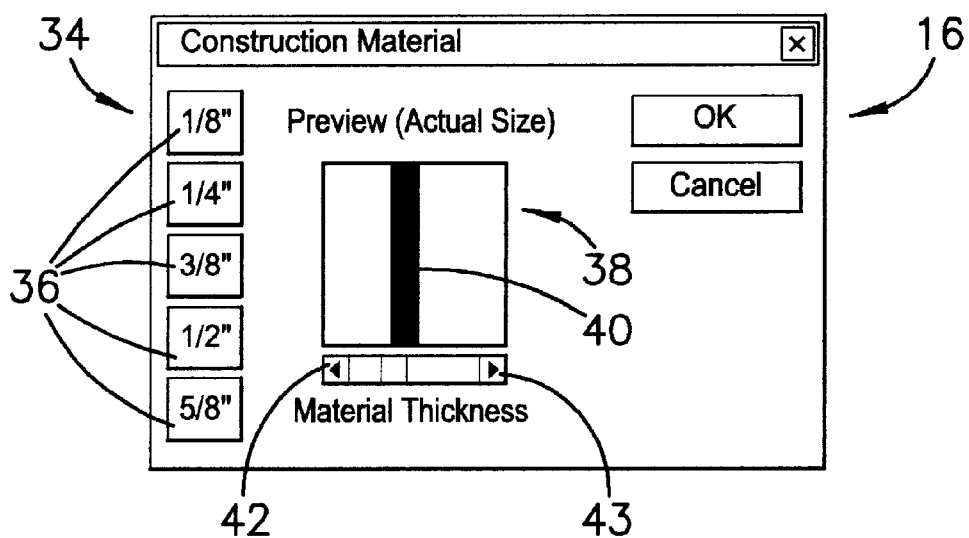
FIG. 4 is a construction material dialogue box which will allow a model maker to select a thickness for the construction material being used.

FIG. 4 shows a construction material selection dialog box 34, which is configured to facilitate the selection of the thickness of an appropriate construction material to be used to build the architectural model (step 220 of FIG. 2). The construction material selection dialog box 34 is displayed on display 16. The model maker may select from a list 36 of standard construction material thicknesses or enter a custom size in custom size window 38. In embodiment of the invention, the construction material dialogue box includes a measurement feature, which allows a model maker to measure the thickness of the construction material being used with a virtual gauge 40 that is displayed on the construction material dialogue box 34. The model maker would simply hold up the construction material to thickness gauge 40 and scroll right and left arrows 42 and 43, respectively, until they are aligned with the chosen construction material's dimensions.

Figure 5:
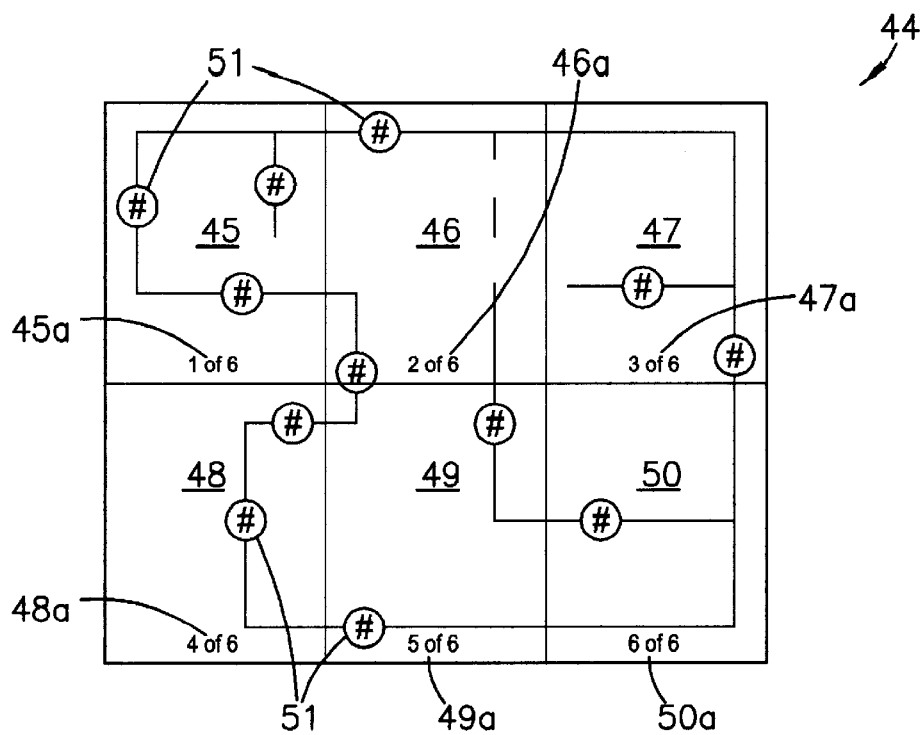
FIG. 5 is a view of six floor templates assembled together to provide a complete floor plan for an architectural model.

FIG. 5 shows, in more detail, how a floor plan is prepared according to steps 225 and 230 of FIG. 2. Depending on the selected scale for the model, it is likely that the three-dimensional architectural model being constructed will be larger in footprint than would fit a standard 8½ inch by 11 inch piece of paper. Accordingly, a typical floor plan 44 will be printed out in sections. For example, a floor plan 44 may include six sections 45–50 that will need to be pieced together to create the complete floor plan. In the preferred embodiment, directions 45a–50a for placing the floor plan sections together correctly will print out on each page. The floor plan sections are then affixed, in their proper relationship, onto a large piece of the construction material chosen (not shown) by the model maker. Preferably, a single piece of construction material is used for the floor plan to provide stability for the entire structure. Included on the floor plan are reference numbers 51, which correspond to wall placement positions. While it is unnecessary to trim around the exterior walls of the architectural design on the first floor plan, the perimeters of second and subsequent floor plans must be trimmed.

Figure 6:
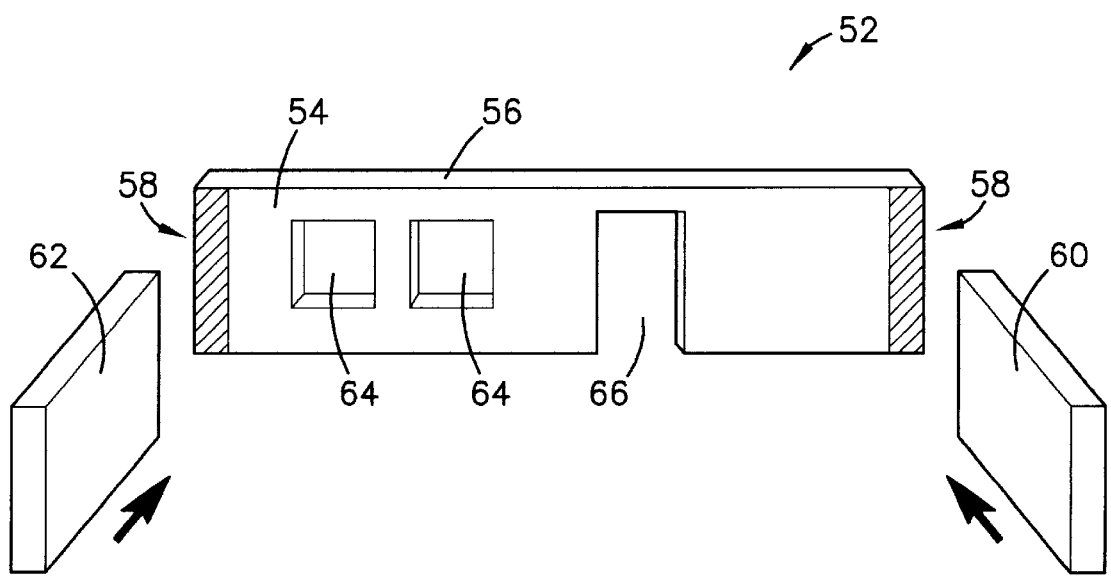
FIG. 6 is a perspective view of a wall panel template applied to the construction material showing shaded areas where additional wall panels will attach.

FIG. 6 shows how templates are used to assist in the preparation of the various components of an architectural model as well as their eventual assembly. In the example shown, a wall section 52 is prepared by affixing wall template 54 is affixed to a piece of construction material 56, such as foamboard. Wall template 54 includes shaded areas 58, which correspond to the thickness of the selected construction material and which indicate the location where additional wall sections, such as wall sections 60 and 62 will attach thereto.

Wall templates, such as template 50 will also include areas representing windows 64 and doors 66. In the example shown, the window and door areas are cut out from the construction material 52. This would allow an architect, client or other person viewing the architectural model to also view the interior of the model to see interior layouts or, in more sophisticated cases interior textures and colors of interior walls, floors and ceilings. However, as will be discussed below, for models that will include exterior rendering of windows and doors, the window and door areas would preferably be left intact.

Figure 7:
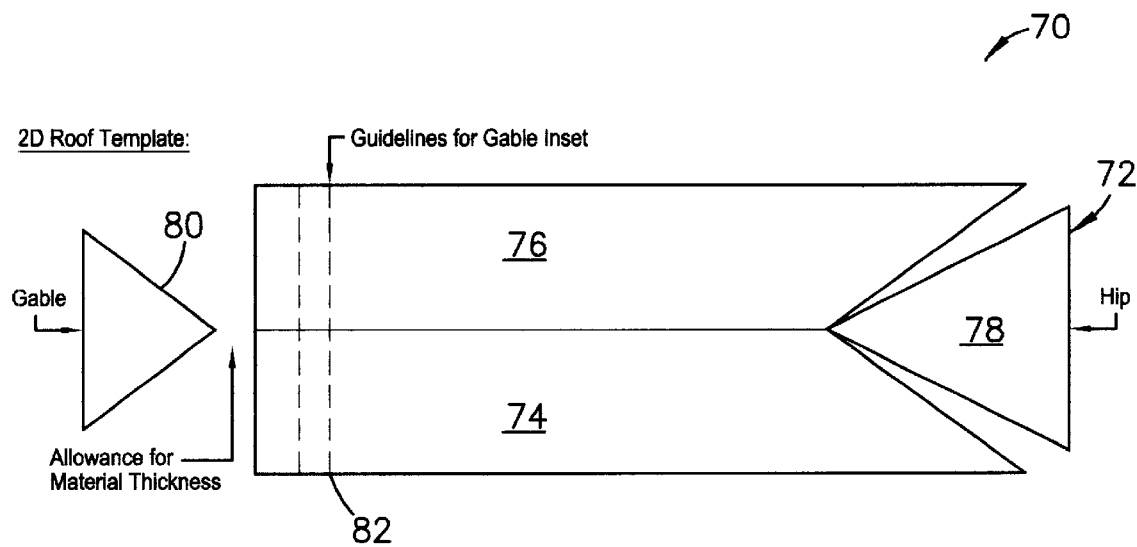
FIG. 7 is a two-dimensional roof template.

FIG. 7 show a two-dimensional roof panel template 70. The roof template 70 may include attached sections, such as the main roof surfaces 72, which include, for example, a first roof template section 74, a second roof template section 76 and a third roof template section 78, which in this example shown is a hip roof section. Additionally, individual, detached roof template sections, such as gable template section 80 may be printed out as well. In any event, each template section should be individually cut out to facilitate its use in preparing the roof panels that will be included on the 3-dimensional architectural model. Assembly guide lines, such s the guide lines for gable inset 83, may also be provided of the roof template(s) to facilitate in the assembly of the roof panels.

Figure 8:
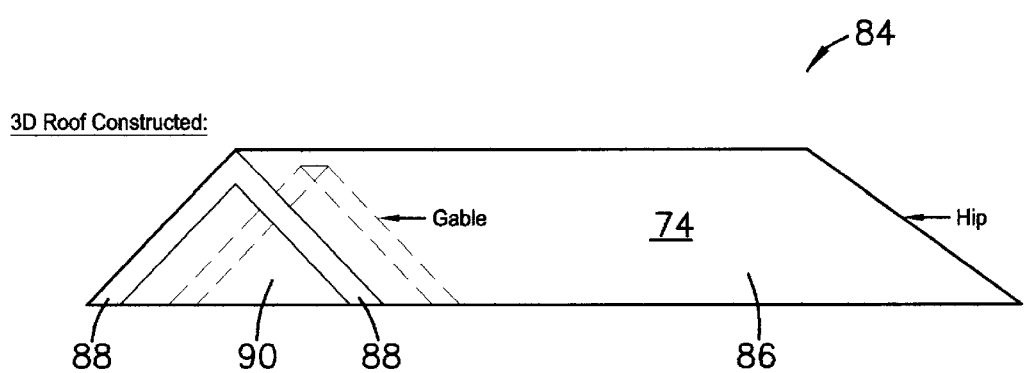
FIG. 8 is a perspective view of a three-dimensional, roof constructed from the two-dimensional roof template of FIG. 7.

FIG. 8 shows a three-dimensional roof 84 constructed according to the template design of FIG. 7. Like the method of constructing wall sections explained above, roof panels, such as first roof panel 86, are prepared by affixing a roof template section, such as first template section 74 onto a piece of construction material 88 and trimming the construction material according to the affixed template. The various roof panels, including the first, second and third roof panel sections, which correspond to the first, second, and third roof template sections, as well as roof gable panel 90 are then assembled according to the template directions, including guide lines 82 (FIG. 7) to form the completed 3-dimensional roof 84. The panels are joined using well known gluing methods and techniques and may involve trimming the various panels at various angles at their edges to account for a desired roof pitch for the architectural design.

Figure 9:
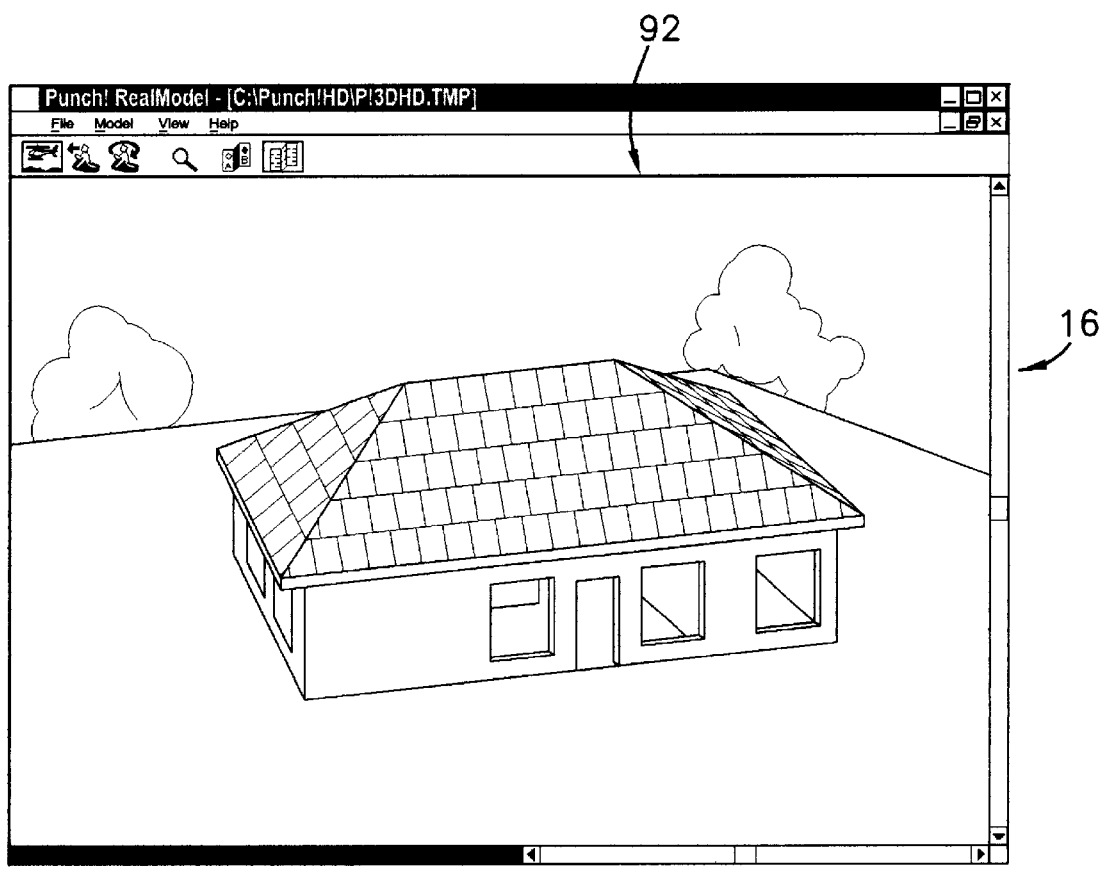
FIG. 9 is a display of the architectural design with surface textures and colors rendered thereon displayed on the computer-aided design system display.

FIG. 9 provides a computer-generated rendering 92 of an architectural design, which is displayed on a computer-aided design system display 16. The computer-generated rendering includes all of the exterior textures selecting by the architect during the preparation of the architectural design.

This rendering may be used by an architect or a client in order to verify the colors and textures of the various panels of the architectural design prior to creating a model. If colors or textures are not to the liking of either the architect, the client or both, then the architect would use the computer-aided design program to manipulate the same until an acceptable colors and textures are applied to the various component parts of the design.

Figure 10:
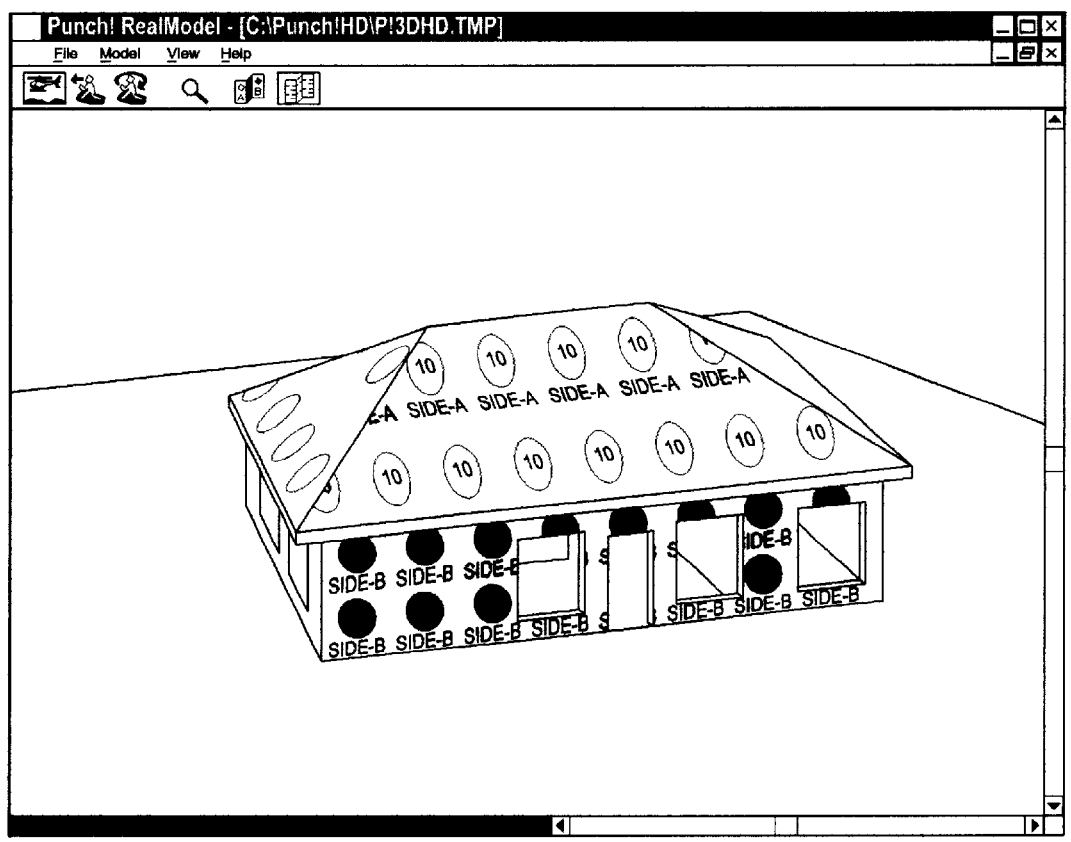
FIG. 10 is a computer-aided design system display showing a rendering of the architectural design showing the template labels, including the appropriate side thereof on the panels that comprise the three-dimensional model.

FIG. 10 shows one embodiment of the invention, wherein a template label view 93 of the architectural design is displayed on the computer-aided design system display 16. This template label view 93 provides a template label rendering 94 of the architectural design showing template label 95, which describe the template numbers 96 and template texture sides 97 for the texture overlays that will be applied to the various model components. As explained earlier, wall templates may contain "A" sides and "B" sides, representing interior and exterior sides of each wall panel, respectively. The designer can use the template label rendering to assist him or her in affixing the appropriate template texture overlays to the appropriate side(s) of the appropriate model panels.

Figure 11:
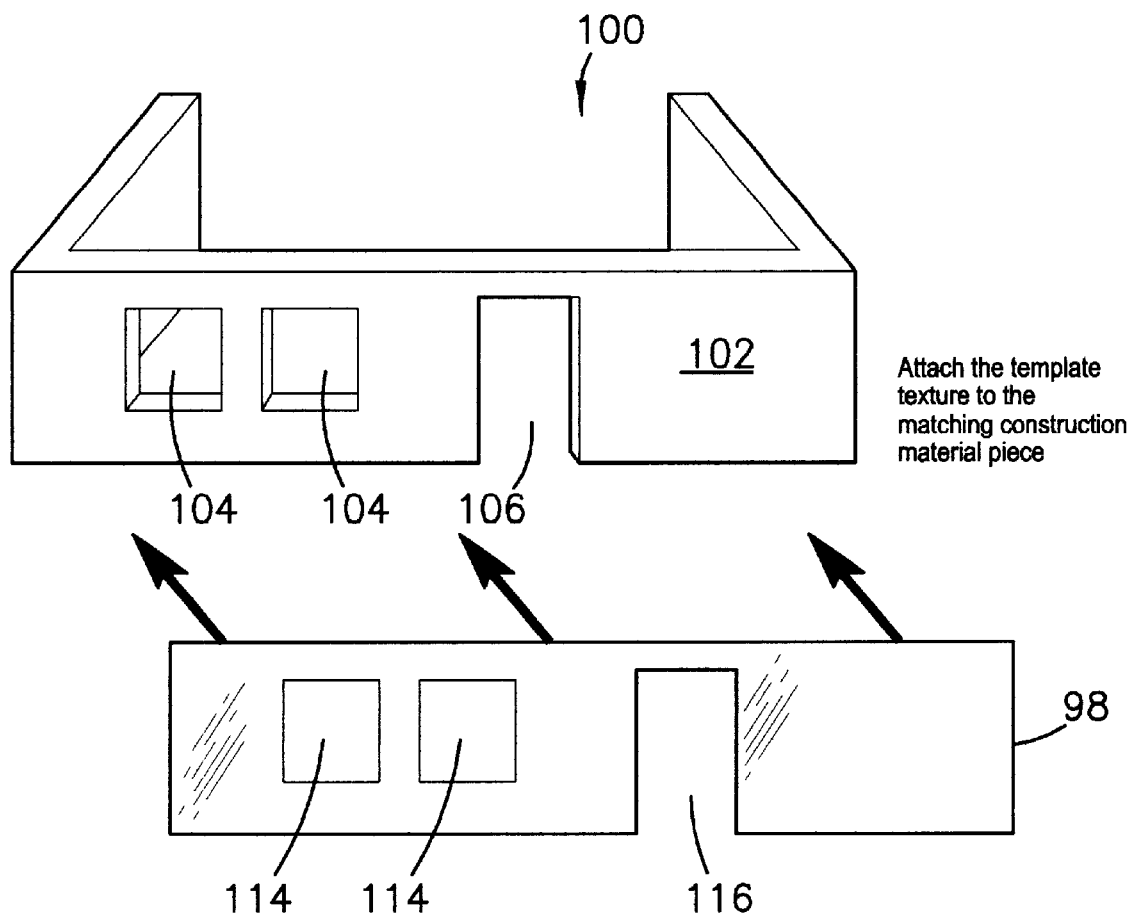
FIG. 11 is a perspective view of a template texture overlay being applied to a cut out wall panel subassembly.

FIG. 11 shows a template texture overlay, 98 being applied to one wall 102 of a constructed wall panel subassembly 100, which includes window openings 104 and door opening 106. The template texture overlay 98 also includes window openings 114 and 116, which correspond to the window and door openings found on wall 102 of the wall panel subassembly 100. As explained earlier, the template texture overlays may need to have those sections, such as window and door openings 114 and 116 removed therefrom, which would allow an architect of client to view the interior of the architectural model to inspect interior walls. In the alternative, if a specific model is constructed for the purpose of only presenting the exterior appearance of an architectural design, then the template texture overlays may include computer-generated renderings of the door and window openings in much the same manner as it would provide the textures and colors of other exterior features found on the design.

Accordingly, the disclosed invention provides a novel and effective system for preparing architectural models, which include three-dimensional, scaled surface textures and colors to provide realistic exterior and interior surfaces of the model.

Modifications and substitutions by one of ordinary skill in the art are considered to be within the scope of the present invention which is not to be limited except by the claims which follow.

What is claimed is:

1. A computer program for creating an architectural model, wherein the computer program is stored on a memory and is executable by a computing device, the computer program comprising:
   a first code segment for allowing a user to print a plurality of scaled templates corresponding to an architectural design, wherein the architectural design includes a surface which is associated with a surface texture;
   a second code segment for allowing the user to print a set of instructions for assembling the plurality of scaled templates to create the architectural model; and
   a third code segment for allowing the user to print a scaled texture overlay corresponding to the surface texture associated with the surface, wherein the scaled texture overlay is separate from the plurality of scaled templates,
   wherein the scaled texture overlay is to be affixed to one of the scaled templates of the plurality of scaled templates, and the plurality of scaled templates are to be assembled in accordance with the set of instructions to create the architectural model.

2. The computer program as set forth in claim 1, wherein the first code segment is further operable to print the plurality of scaled templates to include
   a scaled wall template including a wall surface which is associated with a wall color and a wall surface texture;
   a scaled roof template including a roof surface which is associated with a roof color and a roof surface texture; and
   a scaled floor template including a floor surface which is associated with a floor color and a floor surface texture.

3. The computer program as set forth in claim 1, wherein the first code segment is further operable to print each scaled template of the plurality of scaled templates to include an indication of where each scaled template will contact one or more other scaled templates of the plurality of scaled templates, wherein the indication supplements the set of instructions.

4. The computer program as set forth in claim 1, wherein the first code segment is further operable to print one or more of the plurality of scaled templates to include a textual label communicating the surface texture.

5. The computer program as set forth in claim 1, wherein the third code segment is further operable to print the scaled texture overlay to have a particular color and to represent a particular surface texture.

6. The computer program as set forth in claim 1, wherein the third code segment is further operable to print the scaled texture overlay in the form of a photo-realistic, colored overlay.

7. The computer program as set forth in claim 1, wherein the third code segment is further operable to print the scaled texture overlay to include a void space corresponding to an architectural opening in accordance with the architectural design.

8. The computer program as set forth in claim 1, further comprising a fourth code segment for allowing the user to enter a thickness, and to automatically adjust the printing of the plurality of scaled templates in accordance with the thickness.

9. The computer program as set forth in claim 8, wherein the fourth code segment is further operable to display an interactive virtual thickness gauge operable to allow the user to enter the thickness by electronically selecting a point on the interactive virtual thickness gauge.

10. A computer program for creating an architectural model, wherein the computer program is stored on a memory and is executable by a computing device, the computer program comprising:
    a first code segment for allowing a user to print a plurality of scaled templates corresponding to an architectural design, wherein the architectural design includes a surface which is associated with a surface texture, with one or more of the plurality of scaled templates being printed to include an indication of where each scaled template will contact one or more other scaled templates of the plurality of scaled templates when assembled, and to include a textual label communicating the surface texture;
    a second code segment for allowing the user to print a set of instructions for assembling the plurality of scaled templates to create the architectural model; and
    a third code segment for allowing the user to print a scaled texture overlay corresponding to the surface texture associated with the surface, wherein the scaled texture overlay is separate from the plurality of scaled templates, the scaled texture overlay being printed to include
      a color,
      a representation of the surface texture, and
      a void space corresponding to an architectural opening in accordance with the architectural design,
    wherein the scaled texture overlay is to be affixed to one of the scaled templates of the plurality of scaled templates, and the plurality of scaled templates are to be assembled in accordance with the set of instructions to create the architectural model.

11. The computer program as set forth in claim 10, wherein the first code segment is further operable to create the plurality of printable scaled templates to include
    a scaled wall template including a wall surface which is associated with a wall color and a wall surface texture;
    a scaled roof template including a roof surface which is associated with a roof color and a roof surface texture; and
    a scaled floor template including a floor surface which is associated with a floor color and a floor surface texture.

12. The computer program as set forth in claim 10, wherein the third code segment is further operable to print the scaled texture overlay in the form of a photo-realistic, colored overlay.

13. The computer program as set forth in claim 10, further comprising a fourth code segment for allowing the user to input a thickness, and to automatically adjust the printing of the plurality of scaled templates in accordance with the thickness.

14. The computer program as set forth in claim 13, wherein the fourth code segment is further operable to display an interactive virtual thickness gauge operable to allow the user to enter the thickness by electronically selecting a point on the interactive virtual thickness gauge.

15. A computer program for creating an architectural model, wherein the computer program is stored on a memory and executable by a computing device, the computer program comprising:
    a first code segment for creating a plurality of printable scaled templates based on an electronic architectural design, wherein the architectural design includes a surface which is associated with a surface texture; and
    a second code segment for creating a printable scaled texture overlay corresponding to the surface texture associated with the surface, wherein the printable scaled texture overlay is printable separate from the plurality of printable scaled templates, wherein the architectural model is completed by printing and assembling the plurality of printable scaled templates and affixing the printable scaled texture overlay to one of the plurality of printable scaled templates.

16. The computer program as set forth in claim 15, wherein the first code segment is further operable to allow a user to enter a scale, wherein the printable scaled templates are created in accordance with the entered scale.

17. The computer program as set forth in claim 15, wherein the first code segment is further operable to allow a user to enter a thickness, wherein the printable scaled templates are created in accordance with the entered thickness.

18. The computer program as set forth in claim 17, wherein the first code segment is further operable to display an interactive virtual thickness gauge for allowing the user to enter the thickness by electronically selecting a point on the interactive virtual thickness gauge.

19. The computer program as set forth in claim 15, wherein the first code segment is further operable to create the plurality of printable scaled templates to include a scaled wall template including a wall surface which is associated with a wall color and a wall surface texture;

a scaled roof template including a roof surface which is associated with a roof color and a roof surface texture; and a scaled floor template including a floor surface which is associated with a floor color and a floor surface texture.

20. The computer program as set forth in claim 15, wherein the first code segment is further operable to create each printable scaled template of the plurality of printable scaled templates to include an indication of where each printable scaled template will contact one or more other printable scaled templates of the plurality of printable scaled templates when assembled.

21. The computer program as set forth in claim 15, wherein the first code segment is further operable to print one or more of the plurality of printable scaled templates to include a textual label communicating the surface texture.

22. The computer program as set forth in claim 15, wherein the second code segment is further operable to print the printable scaled texture overlay to have a particular color and to communicate a particular surface texture.

23. The computer program as set forth in claim 15, wherein the second code segment is further operable to print the printable scaled texture overlay in the form of a photo-realistic, colored overlay.

24. The computer program as set forth in claim 15, wherein the second code segment is further operable to print the printable scaled texture overlay to include a void space corresponding to an architectural opening in accordance with the architectural design.

25. The computer program as set forth in claim 15, further comprising a third code segment for substantially automatically creating a set of printable instructions for assembling the plurality of printable scaled templates to create the architectural model.

26. A computer program for creating an architectural model, wherein the computer program is stored on a memory and executable by a computing device, the computer program comprising:

a first code segment operable to allow a user to enter a scale and a thickness, and to substantially automatically create a plurality of printable scaled templates based on the entered scale, the entered thickness, and an electronic architectural design, wherein the architectural design includes a surface which is associated with a surface texture, with one or more of the plurality of scaled templates being created to include an indication of where each printable scaled template of the one or more printable scaled templates will contact one or more other printable scaled templates of the plurality of printable scaled templates when assembled, and to include a textual label communicating the surface texture;

a second code segment for substantially automatically creating a printable scaled texture overlay having a color and a representation of the surface texture associated with the surface, and including a void space corresponding to an architectural opening in accordance with the architectural design, wherein the printable scaled texture overlay is printable separately from the plurality of printable scaled templates; and a third code segment for substantially automatically creating a set of printable instructions for assembling the plurality of scaled templates to create the architectural model, wherein architectural model is created by printing and assembling the plurality of printable scaled templates and by affixing the printable scaled texture overlay to one of the plurality of printable scaled templates in accordance with the set of printable instructions.

27. The computer program as set forth in claim 26, wherein the first code segment is further operable to display an interactive virtual thickness gauge for allowing the user to enter the thickness by electronically selecting a point on the interactive virtual thickness gauge.

28. The computer program as set forth in claim 26, wherein the first code segment is further operable to create the plurality of printable scaled templates to include a scaled wall template including a wall surface which is associated with a wall color and a wall surface texture;

a scaled roof template including a roof surface which is associated with a roof color and a roof surface texture; and a scaled floor template including a floor surface which is associated with a floor color and a floor surface texture.

29. The computer program as set forth in claim 26, wherein the second code segment is further operable to create the printable scaled texture overlay in the form of a photo-realistic, colored overlay.

* * * * *